US006743688B1

(12) United States Patent
Gardner et al.

(10) Patent No.: US 6,743,688 B1
(45) Date of Patent: *Jun. 1, 2004

(54) HIGH PERFORMANCE MOSFET WITH MODULATED CHANNEL GATE THICKNESS

(75) Inventors: Mark I. Gardner, Cedar Creek, TX (US); H. James Fulford, Austin, TX (US); Charles E. May, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/002,964

(22) Filed: Jan. 5, 1998

(51) Int. Cl.⁷ ............................................ H01L 21/336
(52) U.S. Cl. ...................... 438/305; 438/287; 438/591; 438/981
(58) Field of Search .................. 438/305, 303, 438/301, 299, 287, 275, 595, 591, 981; 148/DIG. 163

(56) References Cited

U.S. PATENT DOCUMENTS

| | | | | |
|---|---|---|---|---|
| 4,716,126 A | * | 12/1987 | Cogan | 438/268 |
| 4,945,068 A | * | 7/1990 | Sugaya | 438/264 |
| 4,958,321 A | * | 9/1990 | Chang | 365/185 |
| 5,480,828 A | * | 1/1996 | Hsu et al. | 148/DIG. 16 |
| 5,516,713 A | * | 5/1996 | Hsue et al. | 438/264 |
| 5,672,521 A | * | 9/1997 | Barsan et al. | 438/267 |
| 5,858,825 A | * | 1/1999 | Alsmeier et al. | 438/289 |
| 5,918,133 A | * | 6/1999 | Gardner et al. | 438/299 |
| 5,920,779 A | * | 7/1999 | Sun et al. | 438/275 |

* cited by examiner

Primary Examiner—Michael Trinh

(57) ABSTRACT

A semiconductor device having gate oxide with a first thickness and a second thickness is formed by initially implanting a portion of the gate area of the semiconductor substrate with nitrogen ions and then forming a gate oxide on the gate area. Preferably the gate oxide is grown by exposing the gate area to an environment of oxygen. A nitrogen implant inhibits the rate of $SiO_2$ growth in an oxygen environment. Therefore, the portion of the gate area with implanted nitrogen atoms will grow or form a layer of gate oxide, such as $SiO_2$, which is thinner than the portion of the gate area less heavily implanted or not implanted with nitrogen atoms. The gate oxide layer could be deposited rather than growing the gate oxide layer. After forming the gate oxide layer, polysilicon is deposited onto the gate oxide. The semiconductor substrate can then be implanted to form doped drain and source regions. Spacers can then be placed over the drain and source regions and adjacent the ends of the sidewalls of the gate.

10 Claims, 6 Drawing Sheets

HIGH PERFORMANCE MOSFET WITH MODULATED CHANNEL GATE THICKNESS

FIELD OF THE INVENTION

The present invention relates generally to integrated circuit manufacturing and more particularly to forming insulated gate field effect transistors.

BACKGROUND OF THE INVENTION

An insulated-gate field-effect transistor (IGFET), such as a metal-oxide semiconductor field-effect transistor (NOSFET), uses a gate to control an underlying surface channel joining a source and a drain. The channel, source and drain are located in a semiconductor substrate, with the source and drain being doped oppositely to the substrate. The gate is separated from the semiconductor substrate by a thin insulating layer such as a gate oxide. Currently, the gate oxide is formed having a substantially uniform thickness. The operation of the IGFET involves application of an input voltage to the gate, which sets up a transverse electric field in the channel in order to modulate the longitudinal conductance of the channel.

In typical IGFET processing, the source and drain are formed by introducing dopants of second conductivity type (P or N) into a semiconductor substrate of first conductivity type (N or P) using a patterned gate as a mask. This self-aligning procedure tends to improve packing density and reduce parasitic overlap capacitances between the gate and the source and drain.

Polysilicon (also called polycrystalline silicon, poly-Si or poly) thin films have many important uses in IGFET technology. One of the key innovations is the use of heavily doped polysilicon in place of aluminum as the gate. Since polysilicon has the same high melting point as a silicon substrate, typically a blanket polysilicon layer is deposited prior to source and drain formation, and the polysilicon is anisotropically etched to provide a gate which provides a mask during formation of the source and drain by ion implantation. Thereafter, a drive-in step is applied to repair crystalline damage and to drive-in and activate the implanted dopant.

There is a desire to reduce the dimensions of the IGFET. The impetus for device dimension reduction comes from several interests. One is the desire to increase the number of individual IGFETs that can be placed onto a single silicon chip or die. More IGFETs on a single chip leads to increased functionality. A second desire is to improve performance, and particularly the speed, of the IGFET transistors. Increased speed allows for a greater number of operations to be performed in less time. IGFETs are used in great quantity in computers where the push to obtain higher operation cycle speeds demands faster IGFET performance.

One method to increase the speed of an IGFET is to reduce the length of the conduction channel underneath the gate and dielectric layer regions. However, as IGFET dimensions are reduced and the supply voltage remains constant (e.g., 3 V), the electric field in the channel near the drain tends to increase. If the electric field becomes strong enough, it can give rise to so-called hot-carrier effects. For instance, hot electrons can overcome the potential energy barrier between the substrate and the gate insulator thereby causing hot carriers to become injected into the gate insulator. Trapped charge in the gate insulator due to injected hot carriers accumulates over time and can lead to a permanent change in the threshold voltage of the device.

A number of techniques have been utilized to reduce hot carrier effects. Several methods have been used in the past to form a graded doping region. One common technique for use with a typical gate having a gate oxide with a uniform thickness, is the formation of a graded doping in both the source region and the drain region. The most common way to form a graded doping region is to form a lightly doped region in the drain with a first ion implant using the sidewalls of a gate as a self-aligning mask. Spacers are then formed on the sidewalls of the gate and a second implant of dopant is made. In other words, the drain is typically formed by two ion implants. The first light implant is self-aligned to the gate, and a second heavy implant is self-aligned to the gate on which sidewall spacers have been formed. The spacers are typically oxides or nitrides. The part of the drain underneath the spacers is more lightly doped than the portion of the drain not shielded by the spacers. This more lightly doped region is referred to as a lightly doped drain (LDD).

The LDD reduces hot carrier effects by reducing the maximum lateral electric field. The purpose of the lighter first dose is to form a lightly doped region of the drain (or LDD) at the etch near the channel. The second heavier dose forms a low resistivity heavily doped region of the drain, which is subsequently merged with the lightly doped region. Since the heavily doped region is farther away from the channel than a conventional drain structure, the depth of the heavily doped region can be made somewhat greater without adversely affecting the device characteristics. The lightly doped region is not necessary for the source (unless bidirectional current is used), however lightly doped regions are typically formed for both the source and drain to avoid additional processing steps.

As shown above, a threshold point exists where heightened speed and reduced dimensions will lead to IGFET breakdown. Conventional approaches have encountered difficulty trying to reconcile the methods for decreasing the hot carrier effects and the methods for improving performance. Also, it is desirable to achieve these sought after results without adding costly processing steps. Thus, it is an objective to uncover newly configured IGFET structures and the methods to produce the same which will increase performance while not compromising the IGFET's longevity or fabrication costs.

Graded-drain regions can be created in IGFETs in a number of ways, including: (1) using phosphorus in place of As as the dopant of the source/drain regions; (2) adding fast diffusing phosphorus to an As-doped drain region, and driving the phosphorus laterally ahead of the arsenic with a high temperature diffusion step to create a double-diffused drain [DDD] structure; and (c) pulling the highly doped ($n^+$) drain region away from the drain edge with an "oxide spacer" to create a lightly doped drain (LDD) structure. Each of these methods requires a number of processing steps. Most require two implant steps to form a lightly doped region and a heavily doped region. A method is needed which reduces the number of implant processing steps.

SUMMARY OF THE INVENTION

A semiconductor device having gate oxide with a first thickness and a second thickness is formed by initially implanting a portion of the gate area of the semiconductor substrate with nitrogen ions and then forming a gate oxide on the gate area. Preferably the gate oxide is grown by exposing the gate area to an environment of oxygen. A nitrogen implant inhibits the rate of $SiO_2$ growth in an oxygen environment. Therefore, the portion of the gate area with implanted nitrogen atoms will grow or form a layer of gate oxide, such as $SiO_2$, which is thinner than the portion of the gate area less heavily implanted or not implanted with nitrogen atoms. The gate oxide layer could be deposited rather than growing the gate oxide layer. After forming the gate oxide layer, polysilicon is deposited onto the gate oxide. The semiconductor substrate can then be implanted to form doped drain and source regions. Spacers can then be placed over the drain and source regions and adjacent the ends of the sidewalls of the gate.

A method for forming a semiconductor device to produce graded doping in the source region and the drain region includes the steps of implanting the gate material, usually a polysilicon, with a dopant ion that varies the level of oxide formation on the gate. The dopant ion is driven into undoped polysilicon. Nitrogen ions, may also be implanted in the polysilicon to contain the previously implanted ions. For N-type transistors, typically arsenic is implanted. For P-type transistors, typically boron is implanted. Gates are formed. The gate structure is then oxidized. The oxidation process is controlled to grow a desired thickness of silicon dioxide on the gate. The portion of the gate carrying the dopant grows silicon dioxide either more quickly or more slowly. An isotropic etch can then be used to remove a portion of the silicon oxide and form a knob on each sidewall of the gate. A heavy ion implant is then done to convert a portion of the lightly doped source region into a heavily doped region within the source region, and to convert a portion of the lightly doped drain region into a heavily doped region within the drain region. Some of the implanted ions are stopped by the knobs on the gate sidewalls. The regions under the knobs do not have as deep an ion implantation resulting in a shallow region beneath the knob. This forms a graded junction having a specific geometry. The geometry of the interface between the lightly doped region and the heavily doped region in the source region and the drain region depends on the geometry (thickness) of silicon dioxide knobs formed on the sidewall of the gate and on the length of the knob.

Advantageously, the dimensions of the silicon dioxide knob can be varied to form a graded channel having a different geometry. The steps are easily performed and one implantation for heavy doping is all that is needed to form the graded junction or doping pattern. The resulting device has a longer life, is more reliable and less likely to fail than devices without graded doped drains and sources. In addition, the geometry of the doping profile can be controlled more precisely using this invention. Information handling systems including such a device are also more reliable and long lived.

BRIEF DESCRIPTION OF THE DRAWINGS

The following detailed description of the preferred embodiments can best be understood when read in conjunction with the following drawings, in which.

DETAILED DESCRIPTION OF THE PREFERRED EMBODIMENT

In the following detailed description of the preferred embodiments, reference is made to the accompanying drawings which form a part hereof, and in which are shown by way of illustration specific embodiments in which the invention may be practiced. It is to be understood that other embodiments may be utilized and structural changes may be made without departing from the scope of the present invention.

Figure 1A:
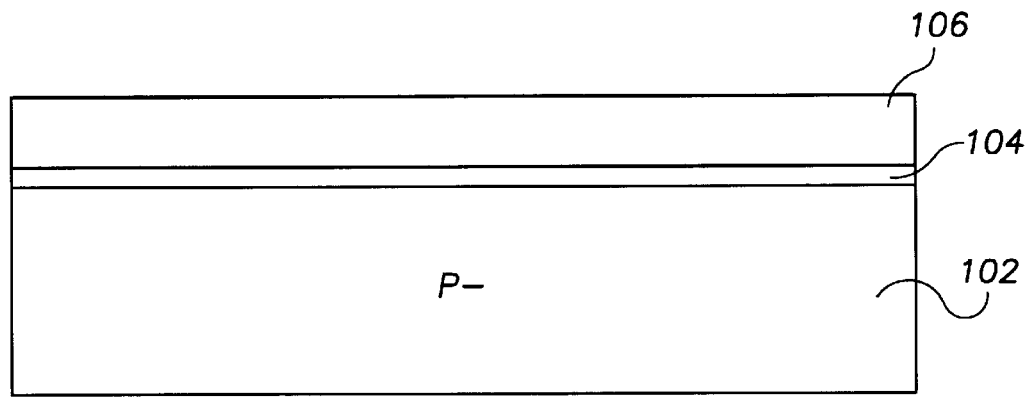
FIGS. 1A–1F show cross-sectional views of successive process steps for making an IGFET having a uniform gate oxide layer and graded doping in the drain region and source region.

An NMOSFET is described to show the most common method for forming a transistor device with a graded source and drain. In FIG. 1A, silicon substrate 102 suitable for integrated circuit manufacture includes a P-type epitaxial layer with a boron background concentration on the order of $1 \times 10^{16}$ atoms/cm$^3$, a<100> orientation and a resistivity of 12 ohm-cm. Preferably, the epitaxial surface layer is disposed on a P+ base layer (not shown) and includes a planar top surface. Gate oxide 104, composed of silicon dioxide ($SiO_2$), is formed on the top surface of substrate 102 using oxide tube growth at a temperature of 700° to 1000° C. in an $O_2$ containing ambient. A typical oxidation tube contains several sets of electronically powered heating coils surrounding the tube, which is either quartz, silicon carbide, or silicon. In $O_2$ gas oxidation, the wafers are placed in the tube in a quartz "boat" or "elephant" and the gas flow is directed across the wafer surfaces to the opposite or exhaust end of the tube. A gate oxide 104 having a uniform thickness is formed.

Thereafter, a blanket layer of undoped polysilicon 106 is deposited by low pressure chemical vapor deposition (LPCVD) on the top surface of gate oxide 104. Polysilicon 106 has a thickness of 2000 angstroms. If desired, polysilicon 106 can be doped in situ as deposition occurs, or doped before a subsequent etch step by implanting arsenic with a dosage in the range of $1 \times 10^{15}$ to $5 \times 10^{15}$ atoms/cm$^2$ and an energy in the range of 2 to 80 kiloelectron-volts. However, it is generally preferred that polysilicon 106 be doped during an implantation step following a subsequent etch step.

Figure 1B:
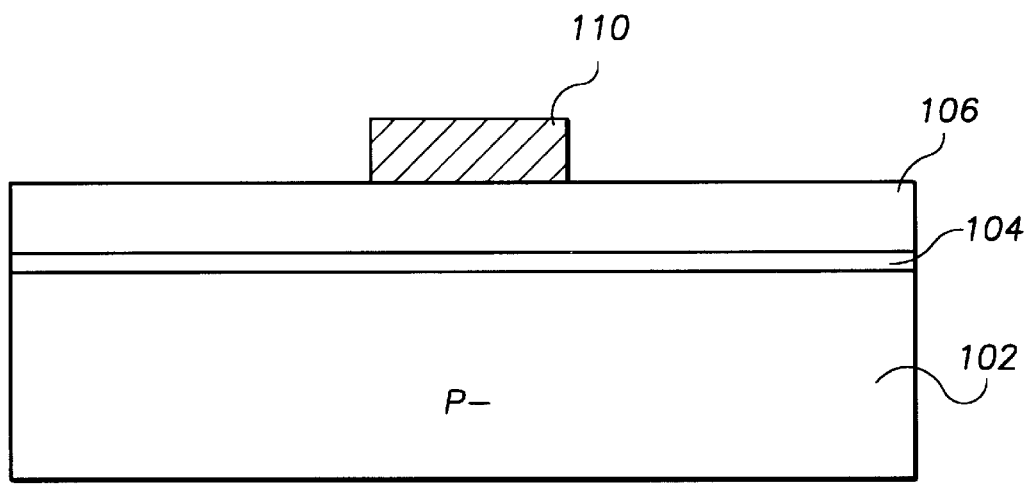

In FIG. 1B, photoresist 110 is deposited as a continuous layer on polysilicon 106 and selectively irradiated using a photolithographic system, such as a step and repeat optical projection system, in which I-line ultraviolet light from a mercury-vapor lamp is projected through a first reticle and a focusing lens to obtain a first image pattern. Thereafter, the photoresist 110 is developed and the irradiated portions of the photoresist are removed to provide openings in photoresist 110. The openings expose portions of polysilicon 106, thereby defining a gate.

Figure 1C:
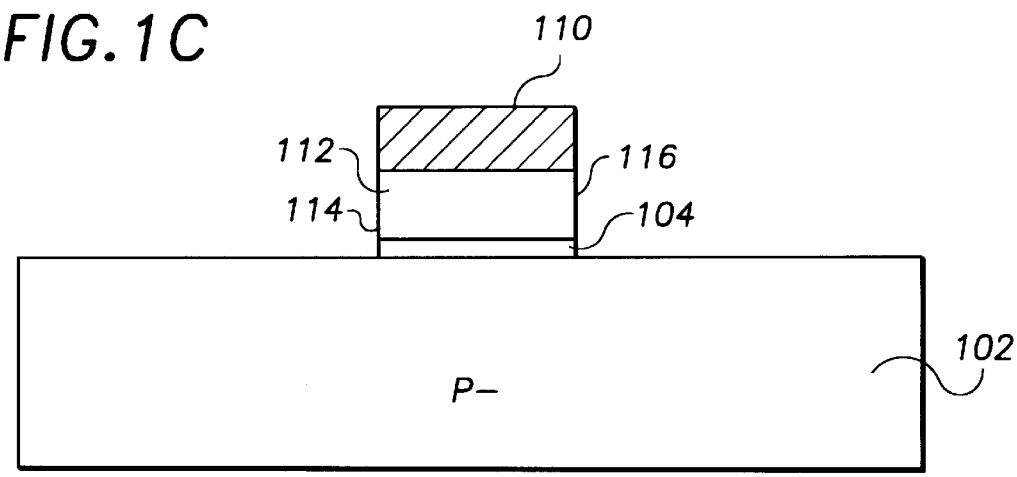

In FIG. 1C, an anisotropic etch is applied that removes the exposed portions of polysilicon 106. Various etchants can be used to anisotropically etch or to selectively remove the polysilicon and oxide layers. Preferably, a first dry or plasma etch is applied that is highly selective of polysilicon. Most of the polysilicon layer 106 is removed, except for the portion beneath the remaining photoresist 110. The gate oxide 104 is left on the surface of the silicon substrate 102 and has a thickness in the range of 30–60 angstroms. Typically, the gate oxide 104 is placed on the surface of the silicon substrate 102 at the selected thickness in the range of 30–60 angstroms. Although unlikely, a second dry or plasma etch may be applied that is highly selective of silicon dioxide (the typical gate material), using the remaining photoresist 110 as an etch mask to thin the layer of the gate oxide 104 to a selected thickness. After the etching step or steps, a gate oxide layer of 30–60 angstroms remains atop the surface of the silicon substrate, and the remaining portion of the polysilicon 106 provides polysilicon gate 112 with opposing vertical sidewalls 114 and 116. Polysilicon gate 112 has a length (between sidewalls 114 and 116) of 3500 angstroms.

Figure 1D:
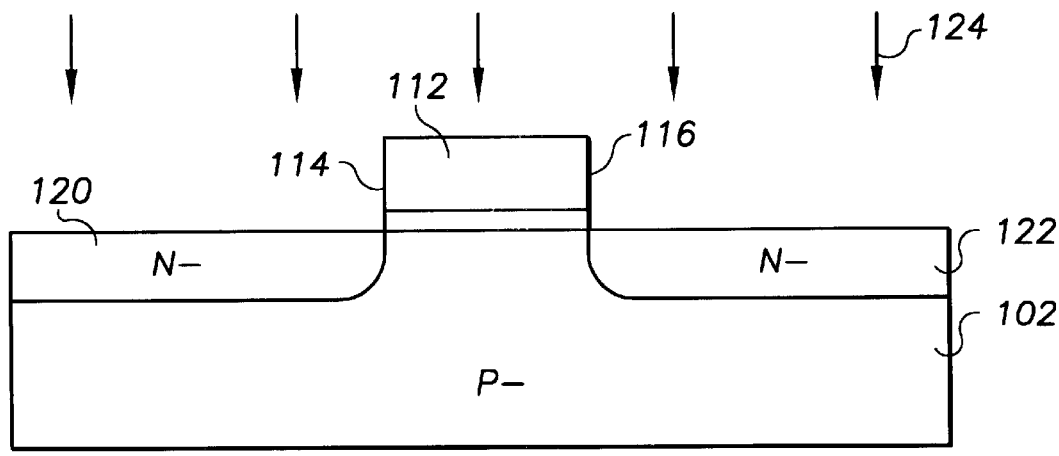

In FIG. 1D, photoresist 110 is stripped, and lightly doped source and drain regions 120 and 122 are implanted into substrate 102 by subjecting the structure to ion implantation of phosphorus, indicated by arrows 124, at a dose in the range of $1\times10^{13}$ to $5\times10^{14}$ atoms/cm$^2$ and an energy in the range of 2 to 35 kiloelectron-volts. The ion implantation of phosphorus is done through the layer of gate oxide 104. Polysilicon gate 112 provides an implant mask for the underlying portion of substrate 102. As a result, lightly doped source and drain regions 120 and 122 are substantially aligned with sidewalls 114 and 116, respectively. Lightly doped source and drain regions 120 and 122 are doped N− with a phosphorus concentration in the range of about $1\times10^{17}$ to $5\times10^{18}$ atoms/cm$^3$.

Figure 1E:
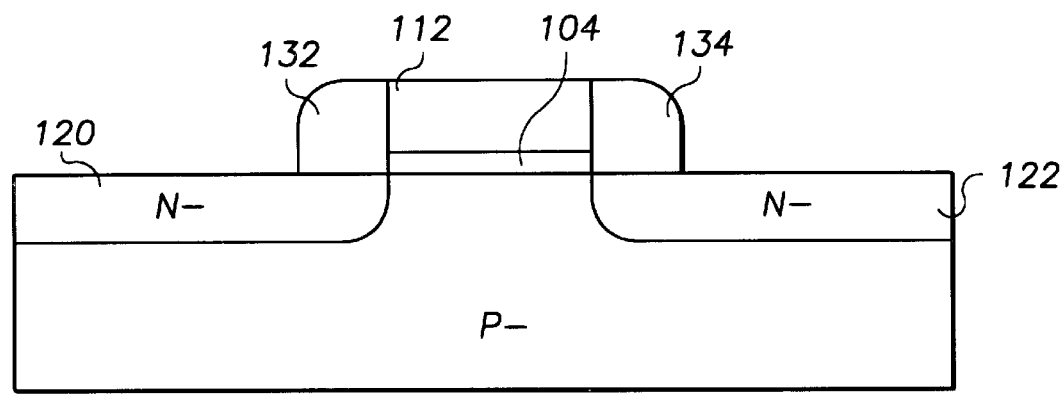

As shown in FIG. 1E, spacers 132 and 134 are formed. A blanket layer of silicon dioxide with a thickness of approximately 2500 angstroms is conformably deposited over the exposed surfaces by CVD at a temperature in the range of 300° C. to 400° C. Thereafter, the structure is subjected to an anisotropic etch, such as a reactive ion etch, that is highly selective of silicon dioxide to form oxide spacers 132 and 134 adjacent to sidewalls 114 and 116, respectively. Oxide spacers 132 and 134 each extend approximately 1200 angstroms across substrate 102.

Figure 1F:
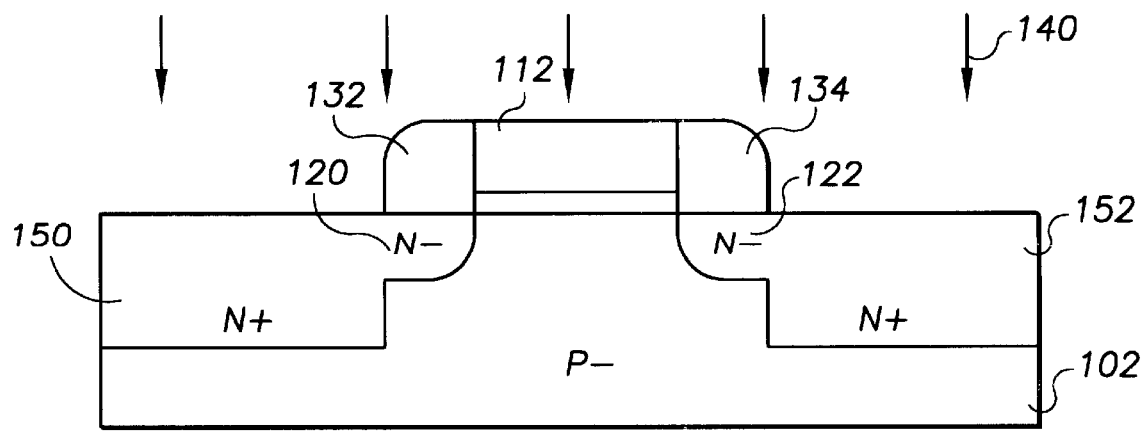

In FIG. 1F, the portions of the lightly doped source region 120 and the lightly doped drain region 122 outside oxide spacers 132 and 134 are converted into heavily doped source region 150 and heavily doped drain region 152 by subjecting the structure to ion implantation of arsenic, indicated by arrows 140, at a dose in the range of $2\times10^{15}$ to $3\times10^{15}$ atoms/cm$^2$ and an energy in the range of 20 to 80 kiloelectron-volts. Polysilicon gate 112 and oxide spacers 132 and 134 provide an implant mask for the underlying portion of substrate 102. As a result, the heavily doped source region 150 and heavily doped drain region 152 are substantially aligned with the oxide spacer 132 on the side opposite sidewall 114, and the oxide spacer 134 on the side opposite sidewall 116. A rapid thermal anneal on the order of 900° to 1050° C. for 10 to 30 seconds is applied to remove crystalline damage and to drive-in and activate the implanted dopants. As a result, heavily doped source region 150 and the lightly doped source region 120 merge to form a source with graded doping. Similarly, heavily doped source region 152 and the lightly doped source region 122 merge to form a drain with graded doping.

Figure 2A:
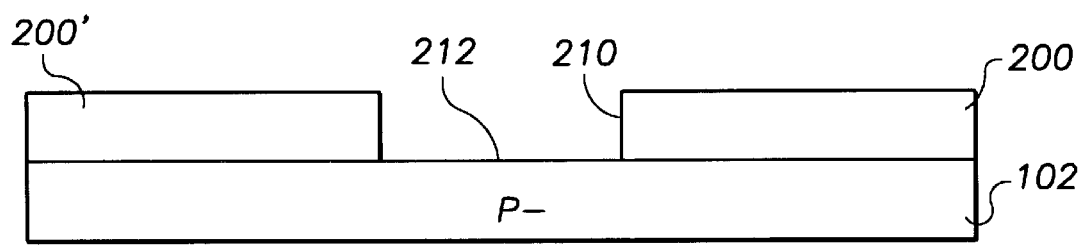
FIGS. 2A–2I show cross-sectional views of successive process steps for making an IGFET with a gate oxide having several thicknesses in accordance with an embodiment of the invention.

As shown in FIG. 2A, a substrate 102 has a field oxide layer 200 deposited upon the substrate. Deposited on the field oxide layer 200 is a photoresist (not shown). The photoresist is masked, exposed and then removed. An etchant is placed in the removed area to form a gate area 210 within the field oxide layer 200. The remaining photoresist is either stripped or removed such that there is a first portion of field oxide layer 200 and a second portion of field oxide layer 200'. The area between the field oxide layers 200 and 200' at the exposed substrate 102 is the gate area 212.

Figure 2B:
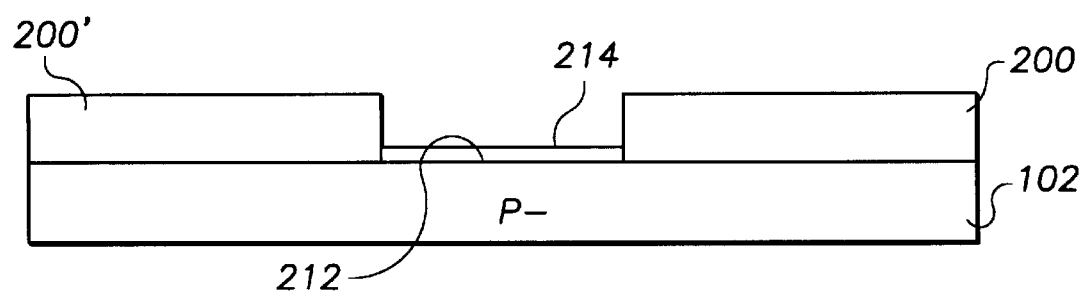
Figure 2C:
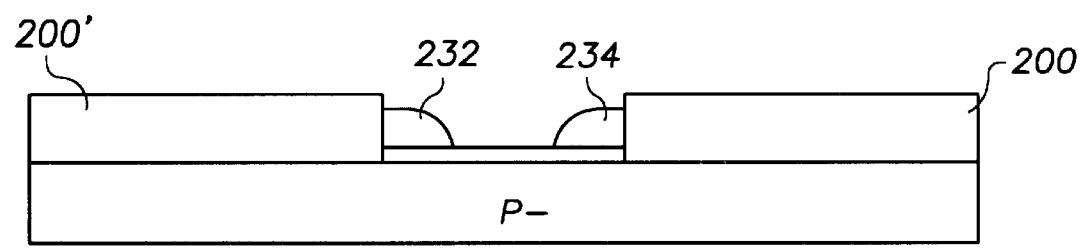

As shown in FIG. 2B, thin oxide layer 214 is grown on the gate area 212. As shown in FIG. 2C the next step is to deposit nitride over the thin oxide layer and then to form nitride spacers from the deposited nitride. A first nitride spacer 232 is formed on one end of the gate area 212 and a second nitride spacer is formed on the other end of the gate area 212. Spacer 232 abuts the field oxide layer 200'. Spacer 234 abuts field oxide layer 200.

Figure 2D:
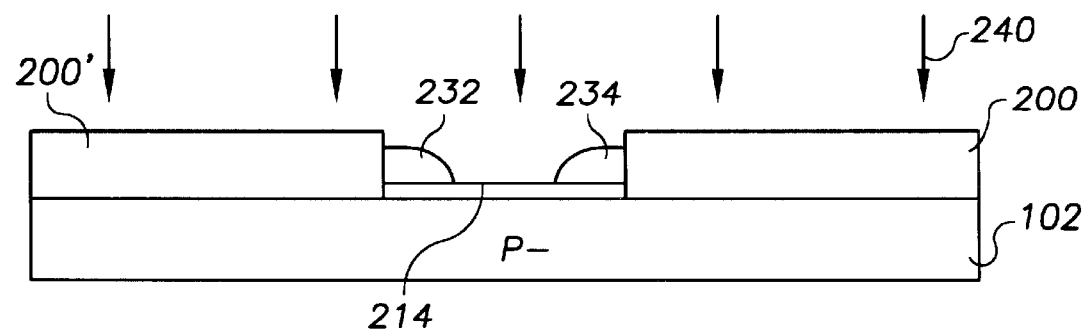

Now turning to FIG. 2D, nitrogen is implanted into the structure, as depicted by arrows 240. The nitrogen implant is at a dose in the range of $1\times10^{14}$ to $2\times10^{15}$ atoms/cm$^2$ and at an energy in the range of 1–20 kiloelectron-volts. Most importantly, the nitrogen is implanted into the silicon layer 102, between the spacers 232 and 234. When nitrogen is implanted into a silicon region, it serves to reduce the rate of subsequent oxide growth at the site of the implant, or in that region.

Figure 2E:
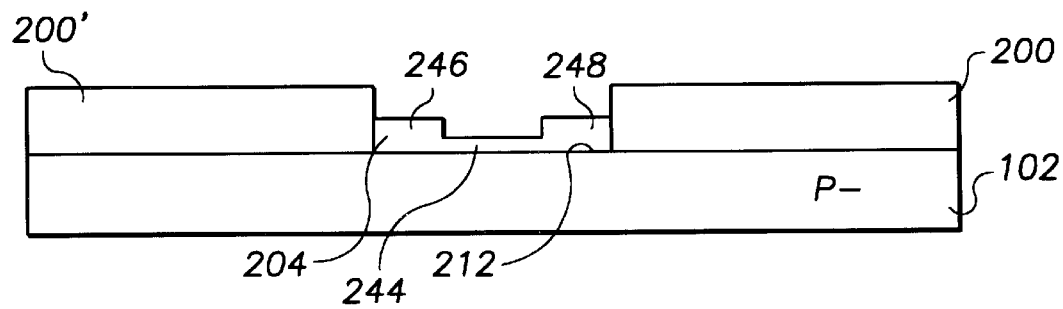

As shown in FIG. 2E, the nitride spacers 232 and 234 have been removed. In addition, an acid etch of hydrofloric acid HF with 10 parts water and one part acid is used as a wet etchant to remove oxide layer 214.

As shown in FIG. 2E, gate oxide 204, composed of silicon dioxide (SiO$_2$), is formed on the top surface of substrate 102 using oxide tube growth at a temperature of 700° to 1000° C. in an O$_2$ containing ambient. A typical oxidation tube contains several sets of electronically powered heating coils surrounding the tube, which is either quartz, silicon carbide, or silicon. In O$_2$ gas oxidation, the wafers are placed in the tube in a quartz "boat" or "elephant" and the gas flow is directed across the wafer surfaces to the opposite or exhaust end of the tube. The oxide layer can also be formed using rapid thermal annealing (RTA). RTA has several advantages over the use of an oxide tube, including less warpage of the wafers and localized heating.

The gate oxide 204 formed is not uniformly thick. The previous implant of nitrogen in the silicon base material 102 of the gate area 212 inhibits the oxidation rate at the surface 212. In other words, the oxide layer 204 will grow slower in a silicon material that is doped with nitrogen when compared to a silicon material not doped with nitrogen. The nitrogen ions are only implanted in the area of the gate which was not covered by the spacers 232 and 234 in FIG. 2D. The rate of oxidation in a silicon region not implanted with nitrogen grows faster than a silicon region implanted with nitrogen. The ratio of oxide growth for the silicon region not implanted with nitrogen is in the range of 1.5:1 to 3.4:1, when compared to the rate of oxidation in a nitrogen implanted region. The end result is that the oxide layer 204 has a thin portion 244 and thick portion 246 and 248. The thick portions 246 and 248 of the oxide layer 204 correspond to the portion of the substrate 102 which was under the spacers 232 and 234. The thin portion 234 of the oxide layer 204 corresponds to the portion of the substrate 204 which was not under the spacers 232 and 234. Since the nitrogen is implanted between the spacers, the layer of oxide 244 is thinner than the portions of the gated area 212 masked by the spacers 232 and 234. The oxide layer 204 with the thin portion 244 and the thick portions 246 and 248 are grown in a single process step.

Figure 2F:
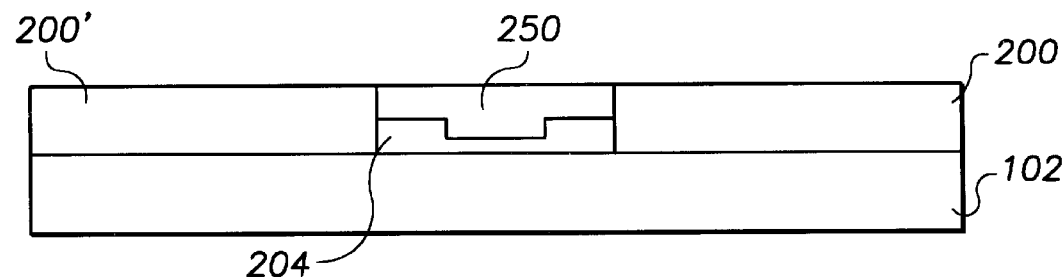

Now turning to FIG. 2F, polysilicon 250 is deposited between the field oxide layer 200' and the field oxide layer 200, and atop the oxide layer 204. After the polysilicon 250 is deposited the top surface of the polysilicon 250 and the oxide layers 200' and 200 are polished to form a smooth surface.

Figure 2G:
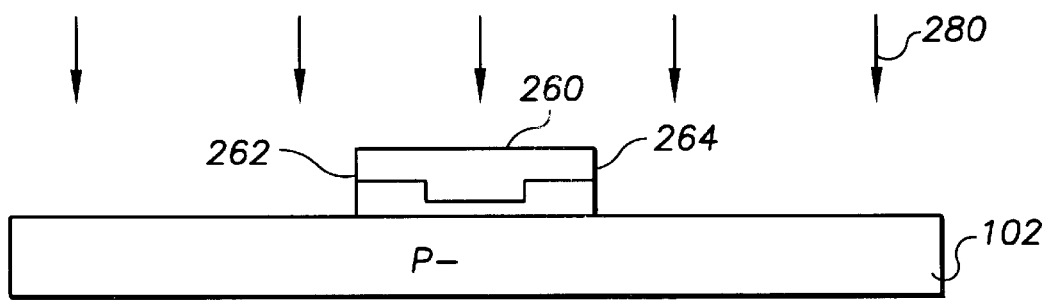

Now turning to FIG. 2G, the oxide layers 200 and 200' are removed using an oxide etch. The oxide etch is very selective to the oxide layers 200 and 200' and can be either a dry or a wet etch. The resulting structure is a gate 260 having sidewalls 262 and 264. The next step is to implant arsenic ions to form a source and drain 272 and 274 (shown in FIG. 2H). The arsenic ion implantation, indicated by arrows 280, is at a dose in the range of $2\times10^{15}$ to $6\times10^{15}$ atoms/cm$^2$ and at an energy in the range of 10–80 kiloelectron-volts.

Figure 2H:
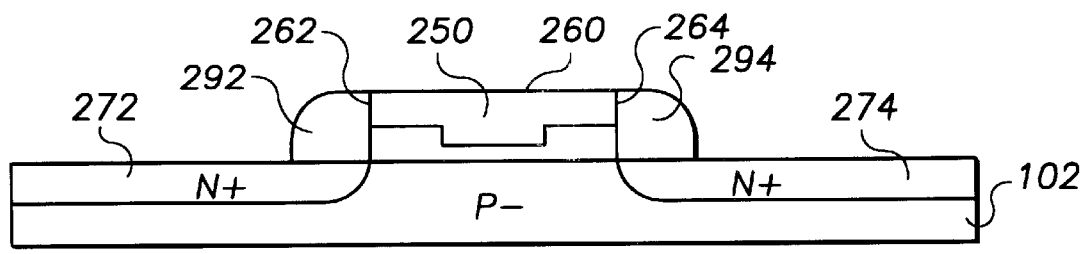
Figure 2I:
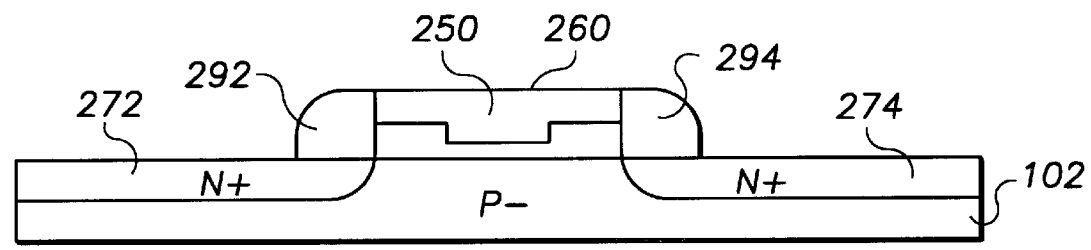

As shown in FIG. 2H, the spacers 292 and 294 are added to the sidewalls 262 and 264. The spacers 292 and 294 are positioned over a portion of the source 272 and the drain 274. As shown in FIG. 2I, the structure is then subjected to a heat treatment such as an annealing process. The end result is that some of the arsenic in the source 272 and drain 274 migrates into some of the silicon substrate 102 underneath the oxide layer 204. This forms a lightly doped region near the gate oxide 204, proximate each end of the gate oxide. Advantageously, only one implant step is required. The channel width can be accurately controlled by controlling the width of the spacers 232 and 234. Although an NMOSFET has been described above, a similar technique could be used to form a PMOSFET.

Further processing steps in the fabrication of IGFETs typically include forming salicide contacts on the gate, source and drain, forming a thick oxide layer over the active region, forming contact windows in the oxide layer to expose the salicide conforming interconnect metallization in the contact windows, and forming a passivation layer over the interconnect metallization. Salicidation includes the formation of spacers on the gate, depositing a metal layer over the entire resulting surface and reacting the metal to form a salicide on top of the gate 112, on the top of the source 120 and on the top of the drain 122. Unreacted metal is then removed, glass is placed over the surface and a contact opening is formed for connectors. A passivation layer may also then deposited as a top surface. In addition, earlier or subsequent high-temperature process steps can be used to supplement or replace the desired anneal, activation, and drive-in functions. These further processing steps are conventional and need not be repeated herein. Likewise the principal processing steps disclosed herein may be combined with other steps apparent to those skilled in the art.

Figure 3:
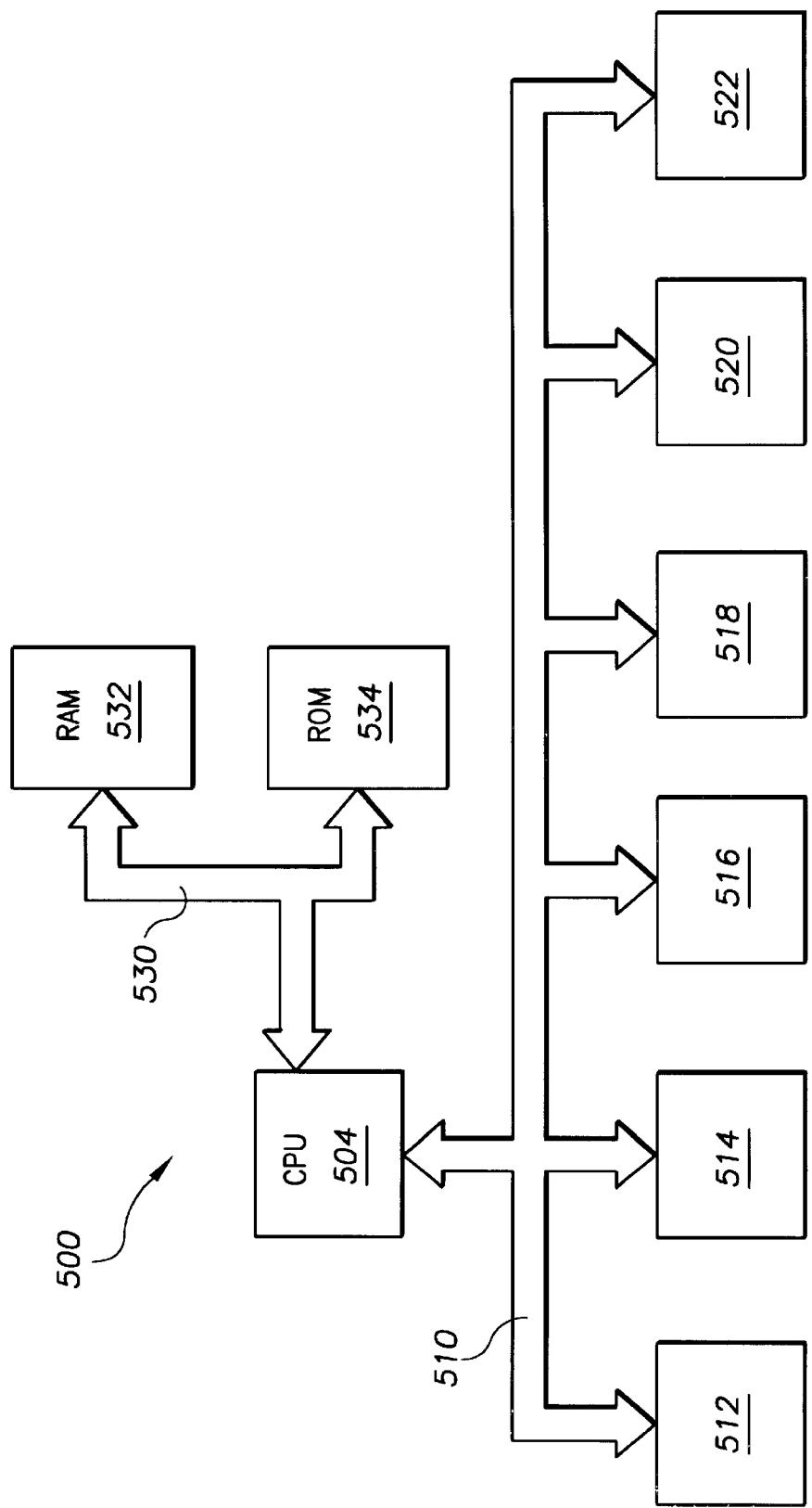
FIG. 3 is a schematic of an information handling system.

The present invention includes numerous variations to the embodiment described above. For instance, the gate insulator and spacers and can be various dielectrics including silicon dioxide, silicon nitride and silicon oxynitride. Suitable N-type dopants include arsenic, phosphorus and combinations thereof. Alternatively, if a P-channel device is desired, suitable P-type dopants include boron, boron species (such as boron difluoride) and combinations thereof Advantageously, the invention is well-suited for use in a device such as an integrated circuit chip, as well as an electronic system including a microprocessor, a memory and a system bus. The electronic system may also be an information handling system 500 as shown in FIG. 3. The information handling system 500 includes a central processing unit 504, a random access memory 532, and a system bus 530 for communicatively coupling the central processing unit 504 and the random access memory 532. The information handling system 500 includes a device formed by the steps shown in FIGS. 2A–2I, as described above. The system 500 may also include an input/output bus 510 and several devices peripheral devices, such as 512, 514, 516, 518, 520, and 522 may be attached to the input output bus 510. Peripheral devices may include hard disk drives, floppy disk drives, monitors, keyboards and other such peripherals. The information handling system 500 includes a device such as is shown in FIG. 2I. The channel formed as in the steps shown in FIGS. 2A–2I and the resulting device provides for a fast and reliable channel having a long life. Faster channels are needed as clocking speeds for microprocessors climb and the channel must also be reliable and long-lived. The drain regions can be formed in one ion implant step rather than several. The length of the channel is also controllable since the spacers can also be controlled.

Although specific embodiments have been illustrated and described herein, it is appreciated by those of ordinary skill in the art that any arrangement which is calculated to achieve the same purpose may be substituted for the specific embodiments shown. This application is intended to cover any adaptations or variations of the present invention. Therefore, it is manifestly intended that this invention be limited only by the claims and the equivalents thereof.

What is claimed is:

1. A method for forming a device comprising the steps of:

providing a silicon substrate having a channel region;

masking a portion of the channel region with a nitride spacer and implanting a portion of the channel region of the silicon substrate with nitrogen ions; and forming a gate oxide over the channel region.

2. The method of claim 1 wherein the step of masking a portion of the channel region with a first nitride spacer located on one end of the channel region and a second nitride spacer on another end of the channel region.

3. The method of claim 2 wherein the step of forming a gate oxide on the channel region includes removing at least one of the first and second spacers from the channel region.

4. The method of claim 2 wherein the step of forming a gate oxide on the channel region includes removing the first and second spacers from the channel region.

5. A method for forming a semiconductor device comprising the steps of:

growing a silicon substrate;

masking the silicon substrate to form an unmasked channel region of the silicon substrate;

forming a thin oxide layer on the unmasked channel region;

masking a portion of the thin oxide layer to form an unmasked implantation region;

implanting the channel region below the unmasked implantation region with nitrogen ions, the nitrogen ions being passed through the thin oxide layer;

removing the thin oxide mask and the thin oxide; and forming a gate oxide over and above the unmasked channel region of the silicon substrate, the portion of the gate oxide over the implanted silicon being thinner than the gate oxide not formed over the implanted silicon.

6. The method of claim 5, wherein forming the gate oxide over and above the unmasked channel region includes forming the gate oxide on the substrate.

7. The method of claim 5, further comprising forming a gate over the gate oxide, the gate width being defined by the width of the unmasked channel region and being about equal in width to the channel region.

8. The method of claim 7, further comprising:

removing the silicon substrate mask; and doping the portion of the silicon substrate adjacent the gate and the channel region to form source/drain regions.

9. The method of claim 8, wherein doping the portion of the silicon substrate adjacent the gate and channel region to form source/drain regions includes forming source/drain regions that are in the same horizontal plane as and adjacent the nitrogen-implanted channel region.

10. The method of claim 8, wherein the source/drain regions are not formed below the nitrogen-implanted channel region.

* * * * *

UNITED STATES PATENT AND TRADEMARK OFFICE
CERTIFICATE OF CORRECTION

PATENT NO.    : 6,743,688 B1
DATED         : June 1, 2004
INVENTOR(S)   : Gardner et al.

It is certified that error appears in the above-identified patent and that said Letters Patent is hereby corrected as shown below:

Title page,
Item [75], Inventors, "(US); H. James Fulford, Austin, TX" should read -- (US); H. Jim Fulford, Austin TX --.

Column 5,
Line 55, "thin oxide" should read -- a thin oxide --.

Column 6,
Line 36, "portion 246" should read -- portions 246 --.

Signed and Sealed this

Twenty-first Day of December, 2004

JON W. DUDAS
*Director of the United States Patent and Trademark Office*